United States Patent
Zhang et al.

(10) Patent No.: US 10,192,900 B2
(45) Date of Patent: Jan. 29, 2019

(54) METHODS FOR FABRICATING THIN FILM TRANSISTOR AND ARRAY SUBSTRATE, ARRAY SUBSTRATE AND DISPLAY DEVICE

(71) Applicants: BOE Technology Group Co., Ltd., Beijing (CN); Beijing BOE Optoelectronics Technology Co., Ltd., Beijing (CN)

(72) Inventors: Jiaxiang Zhang, Beijing (CN); Kai Lu, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 219 days.

(21) Appl. No.: 15/112,275

(22) PCT Filed: Dec. 17, 2015

(86) PCT No.: PCT/CN2015/097727
§ 371 (c)(1),
(2) Date: Jul. 18, 2016

(87) PCT Pub. No.: WO2017/020480
PCT Pub. Date: Feb. 9, 2017

(65) Prior Publication Data
US 2018/0166468 A1    Jun. 14, 2018

(30) Foreign Application Priority Data

Aug. 4, 2015 (CN) .......................... 2015 1 0471390

(51) Int. Cl.
*H01L 27/12*    (2006.01)
*H01L 29/786*   (2006.01)
(Continued)

(52) U.S. Cl.
CPC ........ *H01L 27/127* (2013.01); *H01L 21/0273* (2013.01); *H01L 21/467* (2013.01);
(Continued)

(58) Field of Classification Search
None
See application file for complete search history.

(56) References Cited

U.S. PATENT DOCUMENTS

| 8,586,406 | B1  | 11/2013 | Wu |
| 2010/0304528 | A1* | 12/2010 | Kim ................ H01L 21/02554 438/104 |

(Continued)

FOREIGN PATENT DOCUMENTS

| CN | 102637648 A | 8/2012 |
| CN | 102693938 A | 9/2012 |

(Continued)

OTHER PUBLICATIONS

Aug. 16, 2017—(CN) First Office Action Appn 201510471390.5 with English Tran.
(Continued)

*Primary Examiner* — Michelle Mandala
(74) *Attorney, Agent, or Firm* — Banner & Witcoff, Ltd.

(57) ABSTRACT

Methods for fabricating a thin film transistor and an array substrate, an array substrate and a display device are provided, and the fabrication method of a thin film transistor includes: forming a first photoresist pattern on the active layer film, wherein the first photoresist pattern comprises a photoresist area of a first thickness and a photoresist area in a second thickness; etching the active layer film by using the first photoresist pattern as a mask to form an active layer; ashing the first photoresist pattern to remove the photoresist area of the second thickness and to reduce a thickness of the photoresist area of the first thickness to form the second
(Continued)

photoresist pattern. The second photoresist pattern is used as the mask to etch the source-drain electrode thin film. The fabrication method uses the photoresist pattern to prevent the active layer from being impacted by a source-drain etching solution, and can reduce the usage of a specific etching barrier layer and greatly simplify the fabrication process.

20 Claims, 5 Drawing Sheets

(51) Int. Cl.
　　*H01L 21/027*　　(2006.01)
　　*H01L 21/467*　　(2006.01)
　　*H01L 21/4763*　　(2006.01)
　　*H01L 29/66*　　(2006.01)
　　*H01L 27/32*　　(2006.01)
(52) U.S. Cl.
　　CPC ........ *H01L 21/47635* (2013.01); *H01L 27/12* (2013.01); *H01L 27/1225* (2013.01); *H01L 29/66969* (2013.01); *H01L 29/786* (2013.01); *H01L 29/7869* (2013.01); *H01L 27/3262* (2013.01)

(56) References Cited

U.S. PATENT DOCUMENTS

| | | | |
|---|---|---|---|
| 2015/0034912 | A1 | 2/2015 | Kwon et al. |
| 2015/0318362 | A1 | 11/2015 | Wang et al. |
| 2015/0340504 | A1* | 11/2015 | Choi ................. H01L 29/41733 257/43 |

FOREIGN PATENT DOCUMENTS

| | | |
|---|---|---|
| CN | 103545378 A | 1/2014 |
| CN | 103715096 A | 4/2014 |
| CN | 104091784 A | 10/2014 |
| CN | 104319278 A | 1/2015 |
| CN | 104538356 A | 4/2015 |
| CN | 105161541 A | 12/2015 |

OTHER PUBLICATIONS

Apr. 11, 2016—(WO) International Search Report and Written Opinion Appn PCT/CN20151097727 with English.

\* cited by examiner

METHODS FOR FABRICATING THIN FILM TRANSISTOR AND ARRAY SUBSTRATE, ARRAY SUBSTRATE AND DISPLAY DEVICE

The application is a U.S. National Phase Entry of International Application No. PCT/CN2015/097727 filed on Dec. 17, 2015, designating the United States of America and claiming priority to Chinese Patent Application No. 201510471390.5 filed on Aug. 4, 2015. The present application claims priority to and the benefit of the above-identified applications and the above-identified applications are incorporated by reference herein in their entirety.

TECHNICAL FIELD

Embodiments of the present invention relate to methods for fabricating a thin film transistor and an array substrate, an array substrate, and a display device.

BACKGROUND

A thin film transistor is a thin film semiconductor switching device, which is widely used in the fields of display technology (for example, liquid crystal display technology and organic light emitting diode display technology), integrated circuit technology and so on. Regardless of a liquid crystal display device (LCD) and an organic light emitting diode (OLED) display device, thin film transistors (TFTs) are arranged as the control switches.

Usually, preparing of a thin film transistor includes the following steps: forming a gate electrode through a patterning process, and then forming a gate insulating layer film and an active layer film. An active layer is formed through a patterning process; an etching barrier layer is formed through a patterning process on the corresponding position, for forming a channel area, of the active layer. A source-drain electrode film is formed and then source and drain electrodes are formed through a patterning process. The impact of a source-drain (SD) etching solution on the active layer channel area can be prevented by the formed etching barrier layer. However, an etching barrier layer covering the active layer will inevitably bring about complexity and difficulty to the preparation process. In addition, a mask process is added, and the step and cost are also increased.

SUMMARY

At least one embodiment of the present disclosure provides a method for fabricating a thin film transistor, an array substrate and a fabrication method thereof, and a display device. An etching barrier layer is not specifically formed in the method for fabricating a thin film transistor, a mask process for forming an etching barrier layer can be saved, a stripping process can also be saved, the fabrication process is greatly simplified while ensuring the active layer avoid the impact of the source-drain etching solution.

At least one embodiment of the present disclosure provides a fabrication method of a thin film transistor, which includes an operation of forming an active layer, a source electrode and a drain electrode of a thin film transistor, wherein the source electrode and the drain electrode are separately provided on two sides of the active layer, an interval is provided between the source electrode and the drain electrode to define a channel area, the operation of forming the active layer, the source electrode and the drain electrode of the thin film transistor comprises: forming an active layer film; forming a first photoresist pattern on the active layer film, wherein the first photoresist pattern covers an area of the active layer film for forming the active layer, the first photoresist pattern comprises a photoresist area of a first thickness and a photoresist area of a second thickness, a thickness of the photoresist area of the first thickness is greater than a thickness of the photoresist area in the second thickness, and the photoresist area of the first thickness corresponds to the area of the active layer film for forming the channel area; etching the active layer film by using the first photoresist pattern as a mask to form the active layer; ashing the first photoresist pattern to remove the photoresist area of the second thickness and to reduce the thickness of the photoresist area of the first thickness to form a second photoresist pattern, which corresponds to the area of the active layer for forming the channel area; forming a source-drain electrode film on the active layer and the second photoresist pattern; forming a third photoresist pattern on the source-drain electrode film; etching the source-drain electrode film by using the third photoresist pattern as a mask to form the source electrode and the drain electrode and to expose the second photoresist pattern; and stripping off the second photoresist pattern and the third photoresist pattern.

For example, in the fabrication method of the thin film transistor provided by an embodiment of the disclosure, a distance between photoresist that covers a position where the source electrode is to be formed in the source-drain electrode film and photoresist that covers a position where the drain electrode is to be formed in the source-drain electrode film in the third photoresist pattern is less than or equal to a width of the second photoresist pattern between these positions correspondingly.

For example, in the fabrication method of the thin film transistor provided by an embodiment of the disclosure, forming the first photoresist pattern comprises: forming a photoresist film on the active layer film, exposing and developing the photoresist film through a multi-tone mask plate, to form the first photoresist pattern, wherein the first photoresist pattern includes a photoresist completely reserved area and a photoresist half reserved area, the photoresist completely reserved area corresponds to the area of the active layer for forming the channel area in the active layer film, the photoresist half reserved area corresponds to an area other than the channel area to be formed in the active layer film.

For example, in the fabrication method of the thin film transistor provided by an embodiment of the disclosure, the multi-tone mask plate comprises a halftone mask plate or a gray tone mask plate.

For example, in the fabrication method of the thin film transistor provided by an embodiment of the disclosure, a material of the active layer is an oxide semiconductor.

For example, the fabrication method of the thin film transistor provided by an embodiment of the disclosure further comprises an operation of forming a gate insulating layer, wherein the gate insulating layer is disposed on a gate electrode, and the gate electrode and the gate insulating layer are formed before the active layer film is formed.

At least one embodiment of the present disclosure provides a fabrication method of an array substrate, which includes any one of the fabrication methods of the thin film transistor described above.

For example, the fabrication method of the array substrate provided by an embodiment of the disclosure further comprises the steps of forming a gate line and a data line, wherein the thin film transistor comprises a gate electrode, and the gate line is electrically connected to the gate electrode of the thin film transistor, and the data line is electrically connected to the source electrode of the thin film transistor.

For example, the fabrication method of the array substrate provided by an embodiment of the disclosure further comprises an operation of forming a pixel electrode, wherein the pixel electrode is electrically connected to the drain electrode of the thin film transistor.

For example, the fabrication method of the array substrate provided by an embodiment of the disclosure further comprises an operation of forming a common electrode.

At least one embodiment of the present disclosure further provides an array substrate, fabricated by the method of any one of the above-mentioned method.

At least one embodiment of the present disclosure further provides a display device, which includes the above-mentioned array substrate.

For example, in the display device provided by an embodiment of the disclosure includes a liquid crystal display device or an organic electroluminescent diode display device.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

REFERENCE NUMERALS

Figure 1:
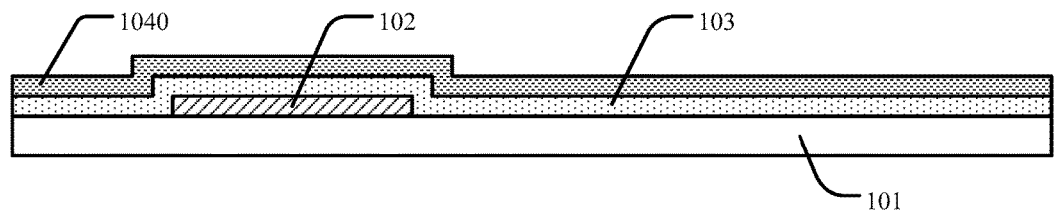
FIGS. 1-9 are flow diagrams of the fabrication process of a thin film transistor provided by an embodiment of the present disclosure.

101—substrate; 102—gate electrode; 103—gate insulating layer; 1040—active layer film; 104—active layer; 1050—source-drain electrode film; 105—source electrode; 106—drain electrode; 107—active layer channel area; 108—passivation layer; 109—pixel electrode; 110—via hole; 1110—photoresist film; 111—first photoresist pattern; 1111—photoresist in the first thickness; 1112—photoresist in the second thickness; 112—second photoresist pattern; 113—third photoresist pattern; 115—thin film transistor; 116—insulating layer; 112—common electrode; 121—gate line; 122—data line.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In each embodiment of the present disclosure, patterning or patterning process may include a photolithography process only, or include a photolithography process and an etching step, or include a printing, an ink jetting and other processes for forming a predetermined pattern. The photolithography process refers to the processes of forming a film, exposing, developing and other processes and uses photoresist, a mask plate, an exposure machine, and so on to form a pattern. A corresponding patterning process can be selected according to the formed structure in each embodiment of the present disclosure.

In each embodiment of the present disclosure, a method for fabricating a thin film transistor includes the steps of forming an active layer, a source electrode and a drain electrode of a thin film transistor, wherein the source electrode and the drain electrode are provided, separate from each other, on both sides of the active layer, an interval is provided between the source electrode and the drain electrode to define a channel area. The steps of forming an active layer, a source electrode and a drain electrode of a thin film transistor comprises: forming an active layer film (the active layer film is formed on a substrate); forming a first photoresist pattern on the active layer film, wherein the first photoresist pattern covers the area of the active layer film for forming the active layer, the first photoresist pattern comprises includes two photoresist areas with different thicknesses: a photoresist area of a first thickness and a photoresist area of a second thickness, and the thickness of the photoresist area of the first thickness is greater than the photoresist area of the second thickness, and the photoresist area in the first thickness corresponds to an area of the active layer film for forming the channel area; etching the active layer film by using the first photoresist pattern as a mask to form an active layer; ashing the first photoresist pattern and reducing the thickness of the photoresist area in the first thickness, to form the second photoresist pattern corresponding to an area of the active layer for forming the channel area; forming a source-drain electrode film on the active layer and the second photoresist pattern; forming a third photoresist pattern on the source-drain electrode film; etching the source-drain electrode film by using the third photoresist pattern as a mask to form a source electrode and a drain electrode and to expose the second photoresist pattern; and stripping off the second photoresist pattern and the third pattern photoresist.

First Embodiment

The present disclosure provides a fabrication method of a thin film transistor. FIG. 1 to FIG. 9 are flow diagrams of the fabrication method of a thin film transistor provided by the embodiment.

As shown in FIG. 1, a gate electrode 102 is formed on a substrate 101. The steps of forming a gate, for example, include: forming a gate electrode film and patterning the gate electrode film to form a gate electrode. For example, the substrate 101 can be a glass substrate, a quartz substrate, or another kind of substrate. For example, the material of the gate electrode 102 includes one or more selected from the group of titanium, tantalum, chromium, aluminum, aluminum alloy, copper, copper alloy, molybdenum, and molybdenum aluminum alloy. For example, the gate electrode 102 can be a single layer structure or a multilayer structure. A gate insulating layer 103 is formed on the substrate 101 which is formed with the gate electrode 102. For example, a chemical vapor deposition method is used to form a gate insulating layer, but the disclosure is not limited to this method. For example, the gate insulating layer 103 can be a single layer structure or a multilayer structure. For example, the material of the gate insulating layer 103 includes one or more selected from the group of silicon nitride (SiNx), silicon oxide (SiOx), and nitrogen oxide (SiNxOy). An active layer film 1040 is formed on the substrate 101 which is formed with a gate insulating layer 103. For example, an active layer film is formed in a magnetron sputtering method, but not limited to this method. For example, the active layer thin film 1040 is an oxide semiconductor thin film, for example, indium gallium zinc oxide (IGZO), indium zinc oxide (IZO), zinc oxide (ZnO) and so on, but not limited to these materials.

Figure 2:
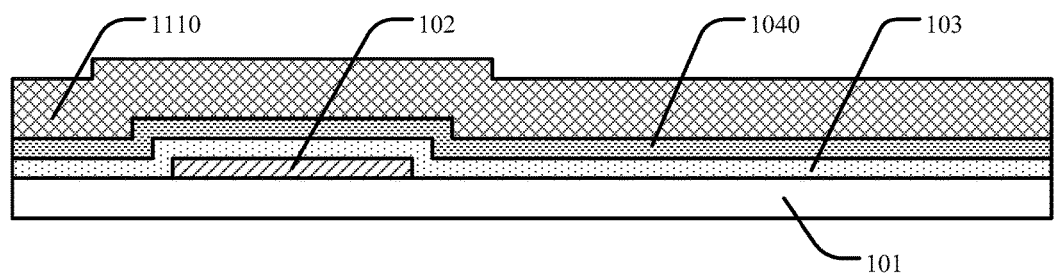

As shown in FIG. 2, a photoresist film 1110 is formed on the active layer film 1040.

Figure 3:
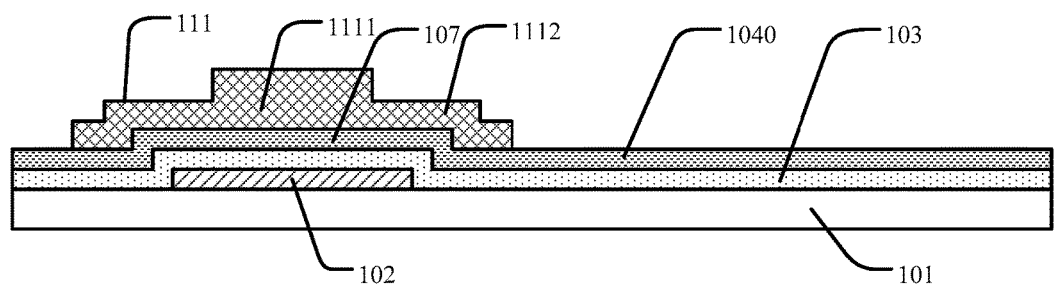

As shown in FIG. 3, a first photoresist pattern 111 is formed. The first photoresist pattern 111 covers the area of the active layer film 1040 for forming the active layer 104 (not shown in FIG. 3 while referring to FIG. 4), the first photoresist pattern 111 includes two photoresist areas with different thicknesses, a photoresist area 1111 of the first thickness and a photoresist area 1112 of the second thickness, and the thickness of the photoresist area 1111 of the first thickness is greater than the thickness of the photoresist area 1112 of the second thickness, and the photoresist area 1111 of the first thickness corresponds to an area of the active layer film 1040 for forming the channel area.

For example, the first photoresist pattern 111 can be formed on the active layer film 1040 by using a photolithography technology.

Figure 4:
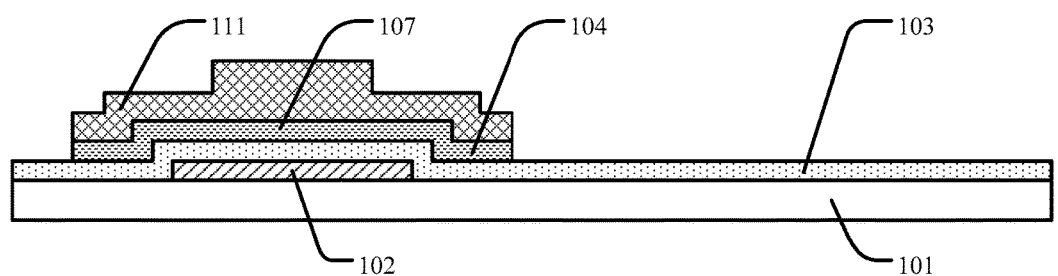

As shown in FIG. 4, the active layer film 1040 is etched by using the first photoresist pattern 111 as a mask, and an active layer 104 is formed.

Figure 5:
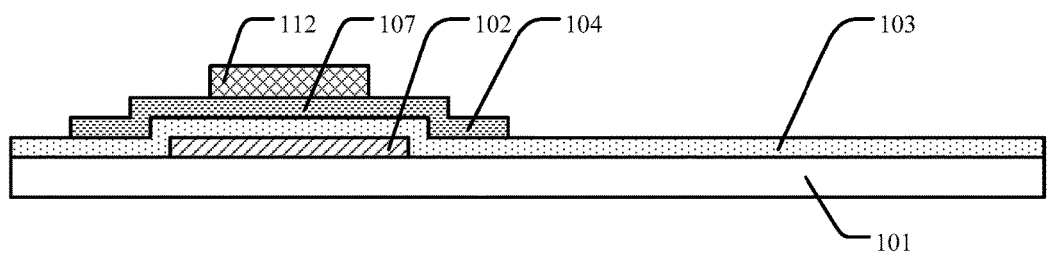

As shown in FIG. 5, the first photoresist pattern 111 is ashed to remove the photoresist area 1112 of the second thickness and the thickness of the photoresist area 1111 in the first thickness is reduced, to form the second photoresist pattern 112 corresponding to an area of the active layer for forming the channel area.

Figure 6:
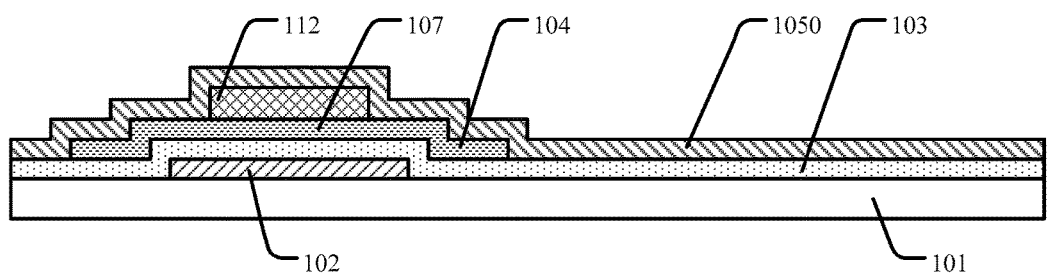

As shown in FIG. 6, a source-drain electrode film 1050 is formed on the substrate 101 which is disposed with an active layer 104 and a second photoresist 112. For example, a source-drain electrode film is formed in a magnetron sputtering method, but not limited to this method. For example, the material of the source-drain electrode film includes one or more selected from the group of titanium, tantalum, chromium, aluminum, aluminum alloy, copper, copper alloy, molybdenum, and molybdenum aluminum alloy, but not limited to these materials.

Figure 7:
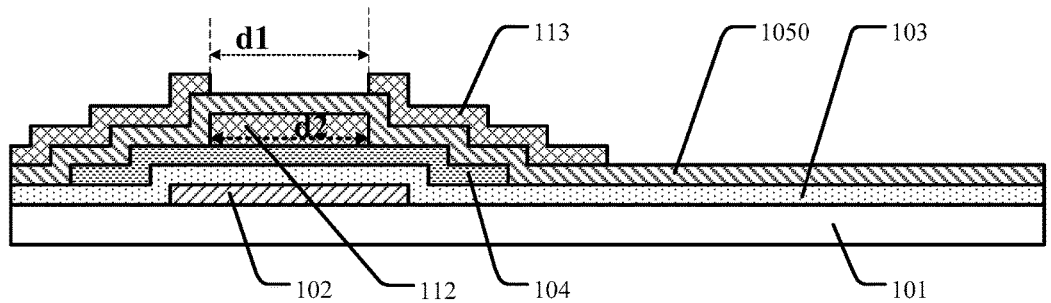

As shown in FIG. 7, a third photoresist pattern 113 is formed on the source-drain electrode film 1050. The area for forming source and drain electrodes of the source-drain electrode film 1050 is covered by the third photoresist pattern 113, and the other areas are exposed.

Figure 8:
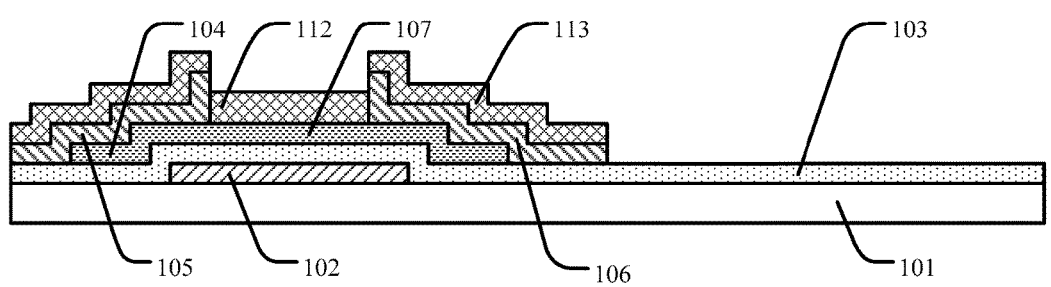

As shown in FIG. 8, the source-drain electrode film 1050 is etched by using the third photoresist pattern as a mask to form a source electrode 105 and a drain electrode 106 and to expose the second photoresist pattern 112 which is formed in the position corresponding to the channel area 107. The source electrode 105 and the drain electrode 106 are separately provided on both sides of the active layer 104, and an interval is left between the source electrode 105 and the drain electrode 106 to define a channel area 107.

Figure 9:
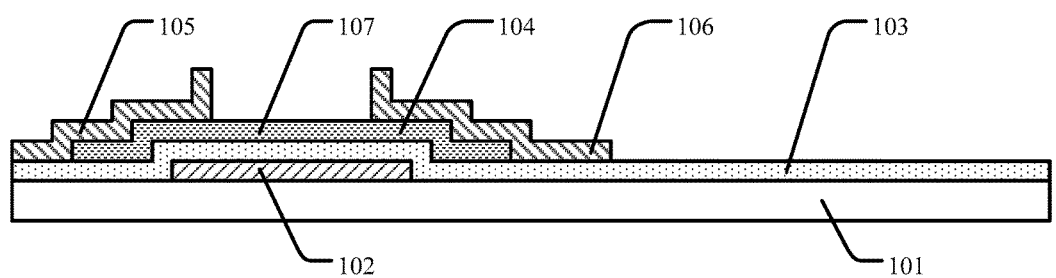

As shown in FIG. 9, the second photoresist pattern 112 and the third photoresist pattern 113 are stripped off. For example, they can be stripped off by a stripping process. Thus, a thin film transistor is obtained here.

For example, in a fabrication method of a thin film transistor which is provided by an example of the embodiment, the distance d1 between the photoresist of the third photoresist pattern 113 covers the position where a source electrode 105 to be formed in the source-drain electrode film 1050 and the photoresist of the third photoresist pattern 113 covers the position where a drain electrode 106 to be formed in the source-drain electrode film 1050 is less than or equal to the width d2 of the second photoresist pattern 112 in the corresponding positions, for example, as shown in FIG. 7. In this way, the second photoresist pattern 112 can completely avoid the impact of the source-drain (SD) etching liquid on the active layer 104 to obtain a better protection effect in the subsequent steps of forming the source electrode 105 and the drain electrode 106 by using the third photoresist pattern 113 as a mask to etch the source-drain electrode film 1050.

For example, in a fabrication method of a thin film transistor which is provided by an example of the embodiment, the steps of forming the first photoresist pattern 111 includes: forming a photoresist film 1110 on the active layer film 1040; exposing and developing the photoresist film 1110 through a multi-tone mask plate, and forming a photoresist pattern, wherein the photoresist pattern includes a photoresist completely reserved area, a photoresist half reserved area, and a photoresist completely removed area. The photoresist completely reserved area corresponds to an area where a channel area 107 of an active layer to be formed in the active layer film 1040, the photoresist half reserved area corresponds to the rest area other than the channel area 107 to be formed, and the photoresist completely removed area corresponds to an area to be etched.

For example, in a fabrication method of a thin film transistor which is provided by an example of the embodiment, the multi-tone mask plate comprises any one of the halftone mask plate and the gray tone mask plate.

For example, in a fabrication method of a thin film transistor which is provided by an example of the embodiment, the material of the active layer 104 includes an oxide semiconductor. For example, the oxide semiconductor includes an indium gallium zinc oxide (indium gallium zinc oxide, IGZO), indium zinc oxide (indium zinc oxide, IZO), or zinc oxide (ZnO), but not limited to these materials.

It should be noted that, the present embodiment is illustrated by the example of a thin film transistor of a bottom gate type, but not limited to this type. For example, the thin film transistor of the embodiment can also be a thin film transistor of a top gate type.

The fabrication method of a thin film transistor provided by the embodiment, the photoresist pattern used in the step of forming an active layer 104 is formed as the first photoresist pattern 111 with different thicknesses, through an ashing process; after the first photoresist pattern 111 is used as a mask to etch the active layer 104, part of the photoresist is removed (the photoresist of the second thickness is removed while the photoresist of the first thickness is thinned), but the photoresist corresponds to an area where a channel area 107 is to be formed in the active layer 104 is remained to obtain the second photoresist pattern 112. Thus, the first photoresist pattern 111 plays the role of a mask for forming an active layer 104, and the second photoresist pattern 112 functions as an etch barrier layer to prevent the active layer 104 from being influenced by the source-drain (SD) etching solution, which can reduce the usage of a specific etching barrier layer, save a mask process, and greatly simplify the fabrication process. Further, the second photoresist pattern 112 is removed without using an individual stripping process, and the second photoresist pattern can be stripped off together with the third photoresist pattern 113 for forming a source electrode 105 and a drain electrode 106 in the subsequent steps, and furthermore the number of the steps is reduced and the cost is reduced.

Second Embodiment

The present embodiment provides a fabrication method of an array substrate, and this method includes the fabrication method of a thin film transistor provided in the first embodiment. Because the fabrication method of a thin film transistor is the same as that described in the first embodiment, detailed descriptions will be omitted here. The photoresist pattern used in the steps of forming an active layer 104 is formed as the first photoresist pattern 111 with different thicknesses; after the first photoresist pattern 111 is used as a mask to etch the active layer 104, and through an ashing process, part of the photoresist is removed (the photoresist of the second thickness is removed while the photoresist of the first thickness is thinned), but the photoresist corresponds to an area where a channel area 107 is to be formed in the active layer 104 is remained to obtain the second photoresist pattern 112. Thus, the first photoresist pattern 111 plays the role of a mask for forming an active layer 104, the second photoresist pattern 112 functions as an etch barrier layer to prevent the active layer 104 from being influenced by the source-drain (SD) etching solution.

Figure 10:
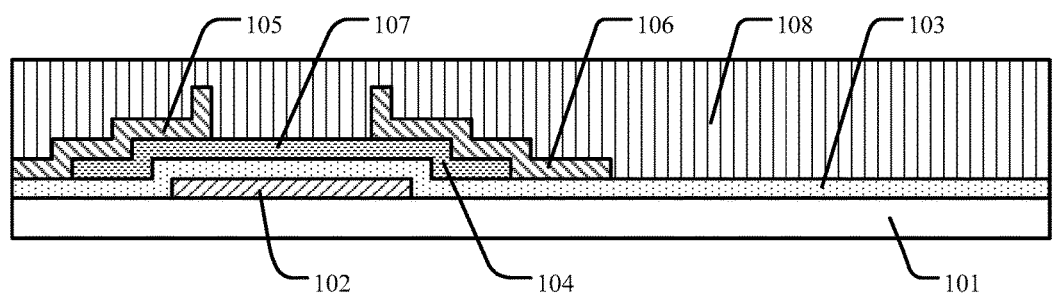
FIGS. 10-11 are flow diagrams of the fabrication process of an array substrate provided by an embodiment of the present disclosure.

For example, as shown in FIG. 10, a fabrication method of an array substrate which is provided by an example of the embodiment further includes: forming a passivation layer 108 on the substrate 101 formed with a thin film transistor. For example, a chemical vapor deposition method is used to form a passivation layer, but not limited to this method. For example, the material of the passivation layer 108 includes one or more selected from the group of silicon nitride (SiNx), silicon oxide (SiOx), and nitrogen oxide (SiNxOy).

Figure 11:
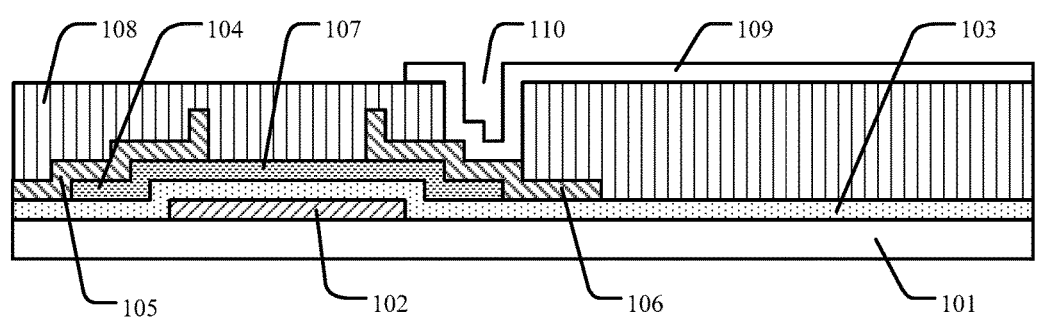

As shown in FIG. 11, a via hole 110 is formed in the passivation layer 108 to expose the drain electrode 106, and then a pixel electrode 109 is formed on the passivation layer 108. For example, an active layer film is formed in a magnetron sputtering method, but not limited to this method. For example, the material of the pixel electrode 109 includes indium tin oxide (ITO) or indium zinc oxide (IZO) or other transparent metal oxide, but not limited to these materials. The pixel electrode 109 is electrically connected to the drain electrode 106 of the thin film transistor through the via hole 110.

Figure 12:
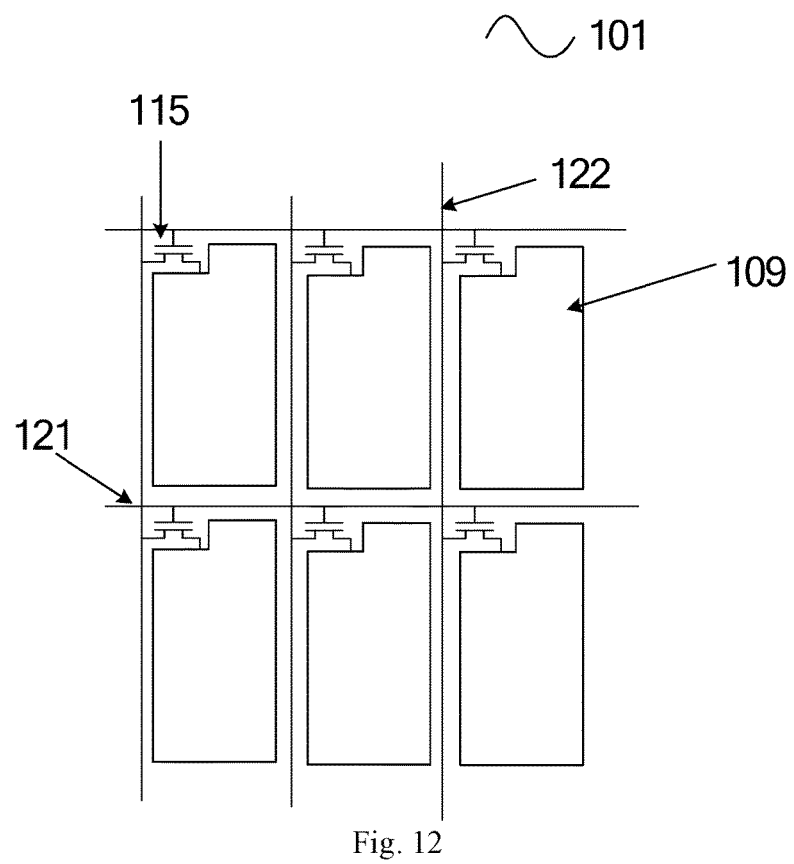
FIG. 12 is a top schematic view of an array substrate provided by an embodiment of the present disclosure.

For example, a fabrication method of an array substrate which is provided by an example of the embodiment further includes the steps of forming a gate line 121 and a data line 122. The gate line 121 is electrically connected to the gate electrode 102 of the thin film transistor, and for example they are formed integrally; the data line 122 is electrically connected to the source electrode 105 of the thin film transistor, for example, they are formed integrally. The top schematic view of the array substrate is shown in FIG. 12.

In the fabrication method of an array substrate provided by the embodiment, the fabrication method of the thin film transistor described in the first embodiment is adopted to fabricate a thin film transistor, which can reduce the usage of a specific etching barrier layer, save a mask process, and greatly simplify the fabrication process. Further, the second photoresist pattern 112 is formed without using an individual stripping process, and the second photoresist pattern can be stripped off together with the third photoresist pattern 113 for forming a source electrode and a drain electrode in the subsequent steps, and furthermore the number of the steps is reduced and the cost is reduced.

Third Embodiment

The present embodiment provides an array substrate, and the array substrate is fabricated in the method described in the second embodiment. For example, as shown in FIG. 11, the array substrate includes a base substrate 101, a gate electrode 102 is disposed on the base substrate 101, a gate insulating layer 103 is disposed on the gate electrode 102, an active layer 104 is disposed on the gate insulating layer 103, a source electrode 105 and a drain electrode 106 are separately provided on both sides of the active layer 104 and are electrically connected to the active layer, a passivation layer 108 is disposed on the source electrode 105, the active layer 104, the drain electrode 106 and the gate insulating layer 103, and a pixel electrode 109 is disposed on the passivation layer 108.

For example, in an example of the embodiment, the substrate 101 can be a glass substrate, a quartz substrate, or another kind of substrate.

For example, in an example of the embodiment, the material of the gate electrode 102 includes one or more selected from the group of titanium, tantalum, chromium, aluminum, aluminum alloy, copper, copper alloy, molybdenum, and molybdenum aluminum alloy, but not limited to these materials.

For example, in an example of the embodiment, the gate insulating layer 103 can be a single layer structure or a multilayer structure.

For example, in an example of the embodiment, the material of the gate insulating layer 103 includes one or more selected from the group of silicon nitride (SiNx), silicon oxide (SiOx), and nitrogen oxide (SiNxOy), but not limited to these materials.

For example, in an example of the embodiment, the material of the active layer 104 includes an oxide semiconductor thin film, for example, indium gallium zinc oxide (IGZO), indium zinc oxide (IZO), zinc oxide (ZnO) and so on.

For example, in an example of the embodiment, an interval is left between the source electrode 105 and the drain electrode 106 to define a channel area 107.

For example, in an example of the embodiment, the material of the passivation layer 108 includes one or more selected from the group of silicon nitride (SiNx), silicon oxide (SiOx), and nitrogen oxide (SiNxOy), but not limited to these materials.

For example, in an example of the embodiment, a pixel electrode 109 is electrically connected to the drain electrode 106 through the via hole 110 which is formed in the passivation layer 108, and for example, the material of the pixel electrode 109 includes indium tin oxide (ITO) or indium zinc oxide (IZO) or other transparent metal oxide, but not limited to these materials.

It should be noted that, the array substrate provided by the embodiment is not limited to be used in a liquid crystal display panel, and for example, it can also be used in an organic light emitting diodes (OLED) display panel.

The array substrate provided by the embodiment, in the process of fabricating the array substrate, the photoresist pattern used in the steps of forming an active layer 104 is formed as the first photoresist pattern 111 with different thicknesses; after the first photoresist pattern 111 is used as a mask to etch the active layer 104, through an ashing process, part of the photoresist is removed, but the photoresist corresponds to an area where a channel area 107 is to be formed in the active layer 104 is remained to obtain the second photoresist pattern 112. Thus, the first photoresist pattern 111 plays the role of a mask for forming an active layer 104, and the second photoresist pattern 112 functions as an etch barrier layer to prevent the active layer 104 from being influenced by the source-drain (SD) etching solution, which can reduce the usage of a specific etching barrier layer, save a mask process, and greatly simplify the fabrication process. Further, the second photoresist pattern 112 is formed without using an individual stripping process, and the second photoresist pattern can be stripped off together with the third photoresist pattern 113 for forming a source electrode and a drain electrode in the subsequent steps, and furthermore the number of the steps is reduced and the cost is reduced.

Figure 13:
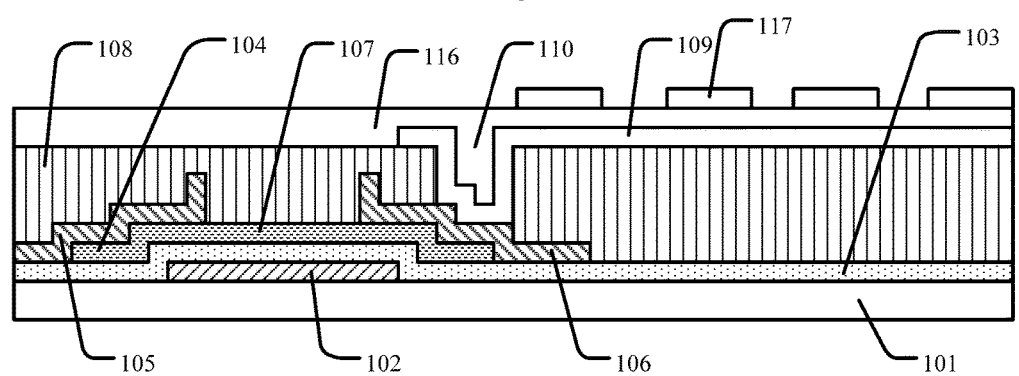
FIG. 13 is a schematic view of an array substrate provided by an embodiment of the present disclosure.
Figure 14:
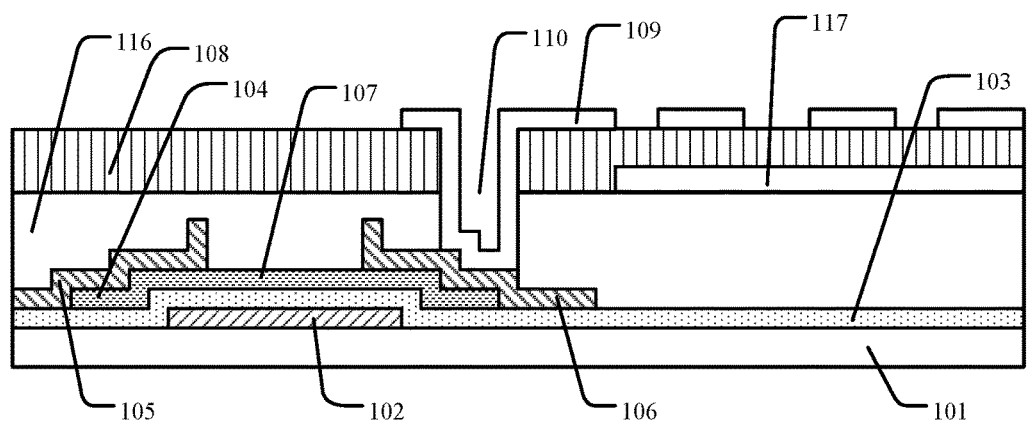
FIG. 14 is another schematic view of an array substrate provided by an embodiment of the present disclosure.

The array substrate provided by another example of the embodiment further includes a common electrode, and therefore the corresponding fabrication method further includes the step of fabricating a common electrode. The common electrode for example can be formed in a different layer from the pixel electrode, for example the common electrode is formed on the pixel electrode or below the pixel electrode; or the common electrode can be formed in the same layer as the pixel electrode. The common electrode, for example, cooperates with the pixel electrode to form a horizontal electric field for driving liquid crystal molecules to deflect, or the common electrode, for example, cooperates with the pixel electrode to form a storage capacitor to increase the stability of the display. The array substrate is shown in FIG. 13 or FIG. 14. The common electrode 117 is disposed on the insulating layer 116; between the pixel electrode 109 and the common electrode 117, an insulating layer 116 or a passivation layer 108 is formed.

Fourth Embodiment

The present embodiment provides a display device, which includes any one of the array substrate.

For example, the display device includes any one of a liquid crystal display device and an organic light emitting diode display device.

For example, the display device can be a display device such as a liquid crystal display, an electronic paper, and an OLED (an organic light-emitting diode) display, and a television, a digital camera, a mobile phone, a watch, a tablet computer, a notebook computer, a navigation system and any other product or component having a display function that includes the display device.

The display device provided by the present embodiment includes any one of the above-mentioned array substrate, the photoresist pattern used in the steps of forming an active layer 104 is formed as the first photoresist pattern 111 with different thicknesses; after the first photoresist pattern 111 is used as a mask to etch the active layer 104, through an ashing process, part of the photoresist is removed, but the photoresist corresponds to an area where a channel area 107 is to be formed in the active layer 104 is remained to obtain the second photoresist pattern 112. Thus, the first photoresist pattern 111 plays the role of a mask for forming an active layer 104, the second photoresist pattern 112 functions as an etch barrier layer to prevent the active layer 104 being influenced by the source-drain (SD) etching solution, which can reduce the usage of a specific etching barrier layer, save a mask process, and greatly simplify the fabrication process. Further, the second photoresist pattern 112 is formed without using an individual stripping process, and the second photoresist pattern can be stripped off together with the third photoresist pattern 113 for forming a source electrode and a drain electrode in the subsequent steps, and furthermore the number of the steps is reduced and the cost is reduced.

There are several points that need to be explained:

(1) The drawings of the embodiment of the disclosure only involve the structure related to the structure of the embodiment of the disclosure, and other structures can be referred to a common design.

(2) For the sake of clarity, in the drawings of each embodiment of the disclosure, the thickness of a layer or an area is enlarged. It can be understood, when an element such as a layer, a film, an area or a substrate is called as "above" or "below" another element, the element can be directly "above" or "below" another element, or an intermediate element is existed.

(3) In the case of no conflict, the embodiment of the disclosure and the characteristics of the embodiment can be combined with each other.

What are described above is related to the illustrative embodiments of the disclosure only and not limitative to the scope of the disclosure, any technical personnel who are familiar with the technical field of the present invention can easily think of change or replacement within the scope of the invention the scopes of the disclosure are defined by the claims.

The present application claims the priority of the Chinese Patent Application No. 201510471390.5 filed on Aug. 4, 2015, which is incorporated herein by reference as part of the disclosure of the present application.

What is claimed is:

1. A fabrication method of a thin film transistor, comprising an operation of forming an active layer, a source electrode and a drain electrode of a thin film transistor, wherein the source electrode and the drain electrode are separately provided on two sides of the active layer, an interval is provided between the source electrode and the drain electrode to define a channel area, the operation of forming the active layer, the source electrode and the drain electrode of the thin film transistor comprises:
- forming an active layer film;
- forming a first photoresist pattern on the active layer film, wherein the first photoresist pattern covers an area of the active layer film for forming the active layer, the first photoresist pattern comprises a photoresist area of a first thickness and a photoresist area of a second thickness, a thickness of the photoresist area of the first thickness is greater than a thickness of the photoresist area in the second thickness, and the photoresist area of the first thickness corresponds to the area of the active layer film for forming the channel area;
- etching the active layer film by using the first photoresist pattern as a mask to form the active layer;
- ashing the first photoresist pattern to remove the photoresist area of the second thickness and to reduce the thickness of the photoresist area of the first thickness to form a second photoresist pattern, which corresponds to the area of the active layer for forming the channel area;
- forming a source-drain electrode film on the active layer and the second photoresist pattern;
- forming a third photoresist pattern on the source-drain electrode film;
- etching the source-drain electrode film by using the third photoresist pattern as a mask to form the source electrode and the drain electrode and to expose the second photoresist pattern; and
- stripping off the second photoresist pattern and the third photoresist pattern;
- wherein a distance between photoresist that covers a position where the source electrode is to be formed in the source-drain electrode film and photoresist that covers a position where the drain electrode is to be formed in the source-drain electrode film in the third photoresist pattern is equal to a width of the second photoresist pattern between these positions correspondingly.

2. The fabrication method of the thin film transistor according to claim 1, wherein forming of the first photoresist pattern comprises:
- forming a photoresist film on the active layer film, exposing and developing the photoresist film through a multi-tone mask plate, to form the first photoresist pattern, wherein the first photoresist pattern includes a photoresist completely reserved area and a photoresist half reserved area, the photoresist completely reserved area corresponds to the area of the active layer for forming the channel area in the active layer film, the photoresist half reserved area corresponds to an area other than the channel area to be formed in the active layer film.

3. The fabrication method of the thin film transistor according to claim 2, wherein the multi-tone mask plate comprises a halftone mask plate or a gray tone mask plate.

4. The fabrication method of the thin film transistor according to claim 1, wherein a material of the active layer is an oxide semiconductor.

5. The fabrication method of the thin film transistor according to claim 1, further comprising an operation of forming a gate insulating layer,
wherein the gate insulating layer is disposed on a gate electrode, and the gate electrode and the gate insulating layer are formed before the active layer film is formed.

6. A fabrication method of an array substrate, comprising the fabrication method of the thin film transistor according to claim 1.

7. The fabrication method of the array substrate according to claim 6, further comprising an operation of forming a gate line and a data line, wherein the thin film transistor comprises a gate electrode, and the gate line is electrically connected to the gate electrode of the thin film transistor, and the data line is electrically connected to the source electrode of the thin film transistor.

8. The fabrication method of the array substrate according to claim 6, further comprising an operation of forming a pixel electrode, wherein the pixel electrode is electrically connected to the drain electrode of the thin film transistor.

9. The fabrication method of the array substrate according to claim 6, further comprising an operation of forming a common electrode.

10. An array substrate, fabricated by the method of claim 6.

11. A display device, comprising the array substrate of claim 10.

12. The display device according to claim 11, wherein the display device includes a liquid crystal display device or an organic electroluminescent diode display device.

13. The fabrication method of the thin film transistor according to claim 1, wherein forming of the first photoresist pattern comprises:
- forming a photoresist film on the active layer film, exposing and developing the photoresist film through a multi-tone mask plate, to form the first photoresist pattern, wherein the first photoresist pattern includes a photoresist completely reserved area and a photoresist half reserved area, the photoresist completely reserved area corresponds to the area of the active layer for forming the channel area in the active layer film, the photoresist half reserved area corresponds to an area other than the channel area to be formed in the active layer film.

14. The fabrication method of the thin film transistor according to claim 13, wherein the multi-tone mask plate comprises a halftone mask plate or a gray tone mask plate.

15. The fabrication method of the thin film transistor according to claim 1, wherein a material of the active layer is an oxide semiconductor.

16. The fabrication method of the thin film transistor according to claim 1, further comprising an operation of forming a gate insulating layer,
wherein the gate insulating layer is disposed on a gate electrode, and the gate electrode and the gate insulating layer are formed before the active layer film is formed.

17. The fabrication method of the thin film transistor according to claim 2, wherein a material of the active layer is an oxide semiconductor.

18. The fabrication method of the thin film transistor according to claim 2, further comprising an operation of forming a gate insulating layer,
wherein the gate insulating layer is disposed on a gate electrode, and the gate electrode and the gate insulating layer are formed before the active layer film is formed.

19. The fabrication method of the array substrate according to claim 7, further comprising an operation of forming a pixel electrode, wherein the pixel electrode is electrically connected to the drain electrode of the thin film transistor.

20. The fabrication method of the thin film transistor according to claim 1, wherein the third photoresist pattern and a pattern of the source electrode and the drain electrode are identical to each other.

* * * * *